(12) United States Patent
Melnik et al.

(10) Patent No.: US 8,138,069 B2
(45) Date of Patent: Mar. 20, 2012

(54) SUBSTRATE PRETREATMENT FOR SUBSEQUENT HIGH TEMPERATURE GROUP III DEPOSITIONS

(75) Inventors: Yuriy Melnik, Santa Clara, CA (US); Olga Kryliouk, Sunnyvale, CA (US); Hidehiro Kojiri, Sunnyvale, CA (US); Tetsuya Ishikawa, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 181 days.

(21) Appl. No.: 12/766,779

(22) Filed: Apr. 23, 2010

(65) Prior Publication Data
US 2010/0273318 A1  Oct. 28, 2010

Related U.S. Application Data

(60) Provisional application No. 61/172,606, filed on Apr. 24, 2009.

(51) Int. Cl.
*H01L 21/20* (2006.01)
(52) U.S. Cl. ............................. 438/479; 257/E21.121
(58) Field of Classification Search .................. 438/479; 257/E21.097, E21.098, E21.099, E21.121
See application file for complete search history.

(56) References Cited

U.S. PATENT DOCUMENTS

| | | | |
|---|---|---|---|
| 4,851,295 A | 7/1989 | Brors | |
| D329,839 S | 9/1992 | Ehrhart | |
| 5,273,588 A | 12/1993 | Foster et al. | |
| 5,348,911 A | 9/1994 | Jurgensen et al. | |
| 5,486,235 A | 1/1996 | Ye et al. | |
| 5,647,911 A | 7/1997 | Vanell et al. | |
| 5,667,592 A | 9/1997 | Boitnott et al. | |
| 5,715,361 A | 2/1998 | Moslehi | |
| 5,762,755 A | 6/1998 | McNeilly et al. | |
| 5,814,239 A | 9/1998 | Kaneko et al. | |
| 5,855,675 A | 1/1999 | Doering et al. | |
| 5,858,471 A | 1/1999 | Ray et al. | |
| 5,871,586 A | 2/1999 | Crawley et al. | |
| 6,086,673 A | 7/2000 | Molnar | |
| 6,156,581 A | 12/2000 | Vaudo et al. | |
| 6,179,913 B1 | 1/2001 | Solomon et al. | |
| 6,200,893 B1 | 3/2001 | Sneh | |
| 6,206,972 B1 | 3/2001 | Dunham | |
| 6,218,280 B1 | 4/2001 | Kryliouk et al. | |
| 6,270,569 B1 | 8/2001 | Shibata et al. | |

(Continued)

FOREIGN PATENT DOCUMENTS

CN    1423834    6/2003

(Continued)

OTHER PUBLICATIONS

PCT International Search Report PCT/US2008/78687 dated Dec. 11, 2008.

(Continued)

*Primary Examiner* — Chandra Chaudhari
(74) *Attorney, Agent, or Firm* — Patterson & Sheridan, L.L.P.

(57) ABSTRACT

Embodiments of the present invention relate to apparatus and method for pretreatment of substrates for manufacturing devices such as light emitting diodes (LEDs) or laser diodes (LDs). One embodiment of the present invention comprises pre-treating the aluminum oxide containing substrate by exposing a surface of the aluminum oxide containing substrate to a pretreatment gas mixture, wherein the pretreatment gas mixture comprises ammonia ($NH_3$) and a halogen gas.

19 Claims, 10 Drawing Sheets

U.S. PATENT DOCUMENTS

| | | |
|---|---|---|
| 6,274,495 B1 | 8/2001 | Omstead et al. |
| 6,290,774 B1 | 9/2001 | Solomon et al. |
| 6,305,314 B1 | 10/2001 | Sneh et al. |
| 6,309,465 B1 | 10/2001 | Jurgensen et al. |
| 6,350,666 B2 | 2/2002 | Kryliouk |
| 6,413,627 B1 | 7/2002 | Motoki et al. |
| 6,451,119 B2 | 9/2002 | Sneh et al. |
| 6,451,695 B2 | 9/2002 | Sneh |
| 6,451,713 B1 | 9/2002 | Tay et al. |
| 6,464,843 B1 | 10/2002 | Wicker et al. |
| 6,475,910 B1 | 11/2002 | Sneh |
| 6,503,330 B1 | 1/2003 | Sneh et al. |
| 6,508,197 B1 | 1/2003 | Omstead et al. |
| 6,528,394 B1 | 3/2003 | Lee et al. |
| 6,540,838 B2 | 4/2003 | Sneh et al. |
| 6,551,399 B1 | 4/2003 | Sneh et al. |
| 6,562,720 B2 | 5/2003 | Thilderkvist et al. |
| 6,562,730 B2 | 5/2003 | Jeng |
| 6,569,765 B1 | 5/2003 | Solomon et al. |
| 6,602,784 B2 | 8/2003 | Sneh |
| 6,616,766 B2 | 9/2003 | Dunham |
| 6,616,870 B1 | 9/2003 | Goela et al. |
| 6,630,401 B2 | 10/2003 | Sneh |
| 6,632,725 B2 | 10/2003 | Trassoudaine et al. |
| 6,638,859 B2 | 10/2003 | Sneh et al. |
| 6,638,862 B2 | 10/2003 | Sneh |
| 6,660,083 B2 | 12/2003 | Tsvetkov et al. |
| 6,676,751 B2 | 1/2004 | Solomon et al. |
| 6,693,021 B1 | 2/2004 | Motoki et al. |
| 6,733,591 B2 | 5/2004 | Anderson |
| 6,849,241 B2 | 2/2005 | Dauelsberg et al. |
| 6,897,119 B1 | 5/2005 | Sneh et al. |
| 6,902,990 B2 | 6/2005 | Gottfried et al. |
| 6,905,547 B1 | 6/2005 | Londergan et al. |
| 6,906,351 B2 | 6/2005 | Kryliouk et al. |
| 6,921,437 B1 | 7/2005 | DeDontney et al. |
| 6,924,159 B2 * | 8/2005 | Usui et al. ............ 438/22 |
| 6,927,426 B2 | 8/2005 | Matsuoka et al. |
| 6,955,211 B2 | 10/2005 | Ku et al. |
| 6,962,624 B2 | 11/2005 | Jurgensen et al. |
| 6,964,876 B2 | 11/2005 | Heuken |
| 6,972,050 B2 | 12/2005 | Bremser et al. |
| 6,983,620 B2 | 1/2006 | Kaeppeler |
| 7,001,791 B2 | 2/2006 | Kryliouk et al. |
| 7,018,940 B2 | 3/2006 | Dunham |
| 7,033,921 B2 | 4/2006 | Jurgensen |
| 7,078,318 B2 | 7/2006 | Jurgensen et al. |
| 7,115,896 B2 | 10/2006 | Guo et al. |
| 7,128,785 B2 | 10/2006 | Kaeppeler et al. |
| 7,147,718 B2 | 12/2006 | Jurgensen et al. |
| 7,364,991 B2 | 4/2008 | Bour et al. |
| 7,368,368 B2 | 5/2008 | Emerson |
| 7,582,515 B2 | 9/2009 | Choi et al. |
| 7,625,448 B2 | 12/2009 | Dauelsberg et al. |
| 7,682,940 B2 | 3/2010 | Ye et al. |
| 2001/0050059 A1 | 12/2001 | Hongo et al. |
| 2002/0136671 A1 | 9/2002 | Otsuka et al. |
| 2003/0024475 A1 | 2/2003 | Anderson |
| 2003/0121608 A1 | 7/2003 | Chen et al. |
| 2004/0221809 A1 | 11/2004 | Ohmi et al. |
| 2006/0021568 A1 | 2/2006 | Matsumoto |
| 2006/0154455 A1 | 7/2006 | Guo et al. |
| 2006/0205199 A1 | 9/2006 | Baker et al. |
| 2007/0010033 A1 | 1/2007 | Aderhold et al. |
| 2007/0108466 A1 | 5/2007 | Kryliouk et al. |
| 2007/0167021 A1 | 7/2007 | Matsumoto |
| 2007/0259502 A1 | 11/2007 | Bour et al. |
| 2008/0050889 A1 | 2/2008 | Bour et al. |
| 2008/0112452 A1 | 5/2008 | Chakraborty et al. |
| 2008/0206464 A1 | 8/2008 | Kappeler |
| 2008/0251801 A1 | 10/2008 | Ueno et al. |
| 2009/0149008 A1 | 6/2009 | Kryliouk et al. |
| 2009/0194026 A1 | 8/2009 | Burrows et al. |

FOREIGN PATENT DOCUMENTS

| | | |
|---|---|---|
| EP | 0 846 791 | 6/1998 |
| EP | 0 966 047 | 6/1999 |
| JP | 2000 012900 | 1/2000 |
| JP | 2000 022212 | 1/2000 |
| JP | 2004-140328 A | 5/2004 |
| JP | 2007-154297 A | 6/2007 |
| JP | 2008-066490 A | 3/2008 |
| KR | 10-0578089 B1 | 5/2006 |
| WO | WO-2009099721 A2 | 8/2009 |

OTHER PUBLICATIONS

Detchprohm et al. "Hydride Vapor Phase Epitaxial Growth of a High Quality GaN Film Using a ZnO Buffer Layer." Appl. Phys. Lett. 61 (22), Nov. 30, 1992, pp. 2688-2690.

Naniwae et al. "Growth of Single Crystal GaN Substrate Using Hydride Vapor Phase Epitaxy." Journal of Crysal Growth 11 (1990), pp. 381-384.

Callahan et al. "Growth of GaN Crystals Under Ammonothermal Conditions." Mat Res Soc. Symp. Proc. vol. 798, 2004, pp. Y2.10.1-Y2.10.6.

Noreika et al. "Growth Characteristics of Ain Films Pyrolytically Deposited on Si." Journal of Applied Physics, vol. 39, No. 12, Nov. 1968, pp. 5578-5581.

Singh et al. "Selective Area Growth of GaN Directly on (0001) Sapphire by the HVPE Technique." MRS Internet J. Nitride Semicond. Res. 3, 13 (1998), pp. 1-4.

S.W. King et al. Abstract, "Cleaning of AlN and GaN Surfaces." Journal of Applied Physics—Nov. 1, 1998—vol. 84, Issue 9, pp. 5248-5260.

Y. Kadoya et al. Abstract, "Ultraclean Etching of GaAs by HCl Gas and in Situ Overgrowth of (Al) GaAs by Molecular Beam Epitaxy." Journal of Applied Physics—Jan. 1, 1998—vol. 83, Issue 1, pp. 567-576.

Dmitriev et al. "Hydride Vapor Phase Epitaxy of Group III Nitride Materials." III-Nitride Semiconductor Material, Chapter 1, pp. 1-40, Editor Zhe Chuan Feng, Imperial College Press, 2006.

International Search Report and Written Opinion dated Dec. 6, 2010 for International Application No. PCT/US2010/032313.

Notice of Second Office Action dated Aug. 16, 2010 for Chinese Patent Application No. 200810168234.1.

Bohnen article, "Enhanced Growth Rates and Reduced Parasitic Deposition by the Substitution of $Cl_2$ for HCl in GaN HVPE", Journal of Crystal Growth 312 (2010) pp. 2542-2550.

Office Action, U.S. Appl. No. 11/925,615 dated Nov. 19, 2010.

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No, 3A. Mar. 1, 1999.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Ban, Vladimir S. "Mass Spectrometric Studies of Vapor-Phase Crystal Growth", vol. 119, Issue 6. pp. 761-765. Jun. 1972.

International Search Report, PCT/US2010/030492 dated Oct. 27, 2010.

Office Action, U.S. Appl. No. 11/767,520 dated Sep. 8, 2010.

International Search Report, PCT/US2010/032032 dated Nov. 26, 2010.

International Search Report, PCT/US2010/032597 dated Dec. 1, 2010.

International Search Report, PCT/US2010/032313 dated Dec. 6, 2010.

\* cited by examiner

SUBSTRATE PRETREATMENT FOR SUBSEQUENT HIGH TEMPERATURE GROUP III DEPOSITIONS

CROSS-REFERENCE TO RELATED APPLICATIONS

This application claims benefit of U.S. Provisional Application Ser. No. 61/172,606, filed Apr. 24, 2009, which is incorporated herein by reference.

BACKGROUND OF THE INVENTION

1. Field of the Invention

Embodiments of the present invention relate to the manufacture of devices such as light emitting diodes (LEDs) or laser diodes (LDs). More particularly, embodiments of the present invention relate to apparatus and method for pretreatment of substrates for manufacturing devices such as light emitting diodes (LEDs) or laser diodes (LDs).

2. Description of the Related Art

Group III nitride semiconductors are finding greater importance in the development and fabrication of a variety of semiconductor devices, such as short wavelength light emitting diodes (LEDs), laser diodes (LDs), and electronic devices including high power, high frequency, high temperature transistors and integrated circuits. Light emitting diodes (LEDs) and laser diodes (LDs) are fabricated by depositing group-III nitrides on sapphire substrates. Group-III nitrides can be deposited by hydride vapor phase epitaxy (HYPE), metal organic chemical vapor deposition (MOCVD), chemical vapor deposition (CVD), and/or physical vapor deposition (PVD) on aluminum oxide containing substrates, such as sapphire substrates.

Aluminum oxide containing substrates need to be pretreated before deposition of group-III nitrides to generate low defect density group-III nitride layers. However, traditional methods for treating aluminum oxide containing substrates may leave by-products on walls of reaction chamber, exhaust lines, and pumps contaminating the manufacturing processes and reducing yield of the facility.

Therefore, there is a general need for methods and apparatus for treating aluminum oxide containing substrates with reduced by-product formation.

SUMMARY OF THE INVENTION

The present invention generally provides apparatus and methods for manufacturing devices such as light emitting diodes (LEDs) or laser diodes (LDs). Particularly, embodiments of the present invention relate to apparatus and methods for pretreatment of substrates for manufacturing devices such as light emitting diodes (LEDs) or laser diodes (LDs).

One embodiment of the present invention provides a method for forming a group-III metal nitride film, comprising heating one or more aluminum oxide containing substrates to a pretreatment temperature, and exposing a surface of each of the one or more aluminum oxide containing substrates to a pretreatment gas mixture when the surface is at the pretreatment temperature to form a pretreated surface, wherein the pretreatment gas mixture comprises ammonia ($NH_3$) and a halogen gas. In some embodiments, the halogen gas comprises chlorine ($Cl_2$) gas.

Another embodiment of the present invention provides a method for forming a group-III metal nitride film, comprising heating one or more aluminum oxide containing substrates to a pretreatment temperature, exposing a surface of each of the one or more aluminum oxide containing substrates to a pretreatment gas mixture when the surface is at the pretreatment temperature to form a pretreated surface, wherein the pretreatment gas mixture comprises ammonia ($NH_3$), a metal halide gas and an etchant containing gas that comprises a halogen gas, and forming a metal nitride layer over the pretreated surface.

Another embodiment of the present invention provides a method for forming a compound nitride structure, comprising providing a substrate having an aluminum oxide containing surface, forming a buffer film on the aluminum oxide containing surface by etching the aluminum oxide containing surface to form AlON or AlN using a gas mixture comprising ammonia and chlorine, and forming a gallium nitride film from a precursor gas mixture comprising a gallium source and a nitrogen source.

Yet another embodiment of the present invention provides a method for forming compound nitride structures comprising providing a plurality of sapphire substrates, positioning the plurality of sapphire substrates in a processing chamber, flowing a first gas mixture to the processing chamber while heating the plurality of sapphire substrates, flowing a pretreatment gas mixture to the processing chamber, wherein the pretreatment gas mixture comprises ammonia and a halogen gas, and flowing a precursor gas mixture to form a group-III metal nitride film on the plurality of sapphire substrates, wherein the precursor gas mixture comprises a group-III metal source and a nitrogen source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
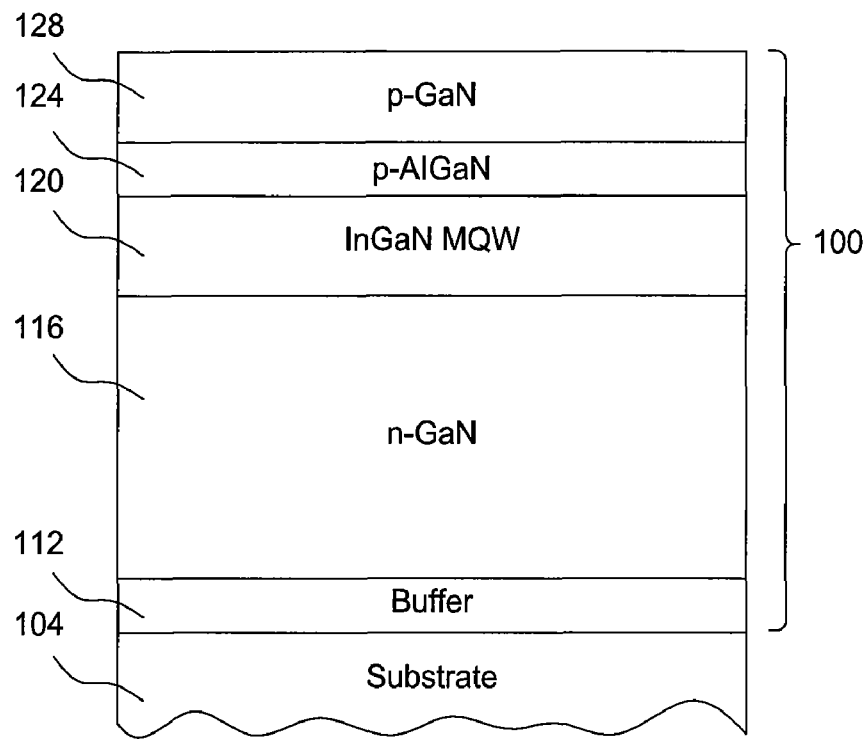
FIG. 1A is a schematic sectional side view of a GaN based LED structure.

Embodiments of the present invention relate to the manufacture of devices such as light emitting diodes (LEDs) or laser diodes (LDs). More particularly, embodiments of the present invention relate to apparatus and method for pretreatment of aluminum oxide containing substrates for manufacturing devices such as light emitting diodes (LEDs) or laser diodes (LDs).

One embodiment of the present invention provides treating a substrate having an aluminum oxide containing surface by exposing the aluminum oxide containing surface to a pretreatment gas mixture comprising ammonia and an etchant containing gas, wherein the etchant containing gas comprises a halogen gas. The halogen gas may be selected from the group consisting of fluorine gas, chlorine gas, bromine gas, iodine gas, combinations thereof, and mixtures thereof. The gas mixture of ammonia and halogen etches the aluminum oxide containing substrates and forms a layer, or a formed region, of aluminum nitride (AlN) and/or aluminum oxynitride (AlON) on the aluminum oxide containing substrate. The layer of AlON or AlN can work as a buffer layer for subsequent group-III metal nitride depositions. Buffer layers can be used to minimize the number of crystalline defects created by the lattice mismatch between the substrate material and the deposited film layer(s), and also reduce, or tune, the film stress in the subsequently deposited layers. Pre-treatment to aluminum oxide containing substrates using ammonia and halogen gas can be used for preparation of any deposition techniques, such as HVPE, MOCVD, CVD, and PVD.

Embodiments of the present invention have advantages over traditional pre-treatment and nitridation of aluminum oxide containing substrates because the use of a halogen gas in the pretreatment process produces a drastic decrease in the formation of harmful by-products. For example, ammonia chloride ($NH_4Cl$) forms as a by-product in traditional pretreatment of sapphire substrates using HCl and ammonia before depositing group-III nitride layers on the sapphire substrates. Ammonia chloride may sublime to a solid powder and stick to walls of the reaction chamber, exhaust line and vacuum pump. The ammonia chloride powder may also be transmitted through the entire processing system, for example with the substrates, carriers, or robots. By drastic decrease in the formation of harmful by-product, embodiments of the present invention improves throughput and increases quality in applicable manufacturing processes, such as manufacturing of LEDs and LDs.

In one embodiment, a nitriding process is performed in combination with exposing the aluminum oxide containing substrate to the pretreatment gas mixture. The nitriding processes may be performed by exposing the aluminum oxide containing substrates with a nitriding gas mixture comprising a nitrogen source. The nitrogen source may be ammonia. The nitriding process may be performed prior to or after the pretreatment process.

In one embodiment, a group-III metal nitride buffer layer is formed after pretreatment. The group-III metal nitride buffer layer may an aluminum nitride buffer layer or gallium nitride buffer layer. The aluminum nitride buffer layer may be formed on the aluminum oxide containing substrate by exposing the substrate to a buffering gas mixture comprising an aluminum precursor. The gallium nitride buffer layer may be formed on the aluminum oxide containing substrate by exposing the substrate to a buffering gas mixture comprising a gallium precursor and a nitrogen source. In another embodiment, the group-III metal nitride buffer layer is formed simultaneously with the pretreatment by simultaneously flowing a nitrogen source, such as ammonia, a halogen gas, such as chlorine gas, and a group-III metal halide precursor, such as aluminum chloride or gallium chloride. In one embodiment, the pretreatment process further comprises a nitriding process and a buffer layer forming process. The buffer layer may comprise an aluminum nitride (AlN) and/or aluminum oxynitride (AlON), or gallium nitride (GaN).

FIG. 1A is a schematic sectional side view of a gallium nitride based LED structure 100. The LED structure 100 is fabricated over an aluminum oxide containing substrate 104. The substrate 104 may be formed from solid aluminum oxide, such as single crystal sapphire substrate having a C-axis crystal orientation of (0001). The substrate 104 may also be a composite substrate having a surface containing aluminum oxide for fabricating a compound nitride structure thereon. Any well known method, such as masking and etching may be utilized to form features from a planar substrate to create a patterned substrate. In a specific embodiment, the patterned substrate is a (0001) patterned sapphire substrate (PSS). Patterned sapphire substrates may be ideal for use in the manufacturing of LEDs because they increase the light extraction efficiency which is useful in the fabrication of a new generation of solid state lighting devices.

In one embodiment, the LED structure 100 is formed on the substrate 104 after a pretreatment process. The thermal cleaning procedure may be performed by exposing the substrate 104 to a cleaning gas mixture comprising ammonia and carrier gas while the substrate 104 is being heated. In one embodiment, the pretreatment process comprises exposing the substrate to a pretreatment gas mixture while the substrate is heated an elevated temperature range. In one embodiment, the pretreatment gas mixture is an etching agent comprising a halogen gas. In one embodiment, the pretreatment gas mixture comprises a halogen gas and ammonia. As shown in FIG. 1A, the LED structure 100 formed on the substrate 104 generally comprises a buffer layer 112 deposited over the cleaned and pretreated substrate 104. The buffer layer 112 may be formed by a HVPE process or a MOCVD process. Traditionally, the buffer layer 112 may be deposited by providing Gallium and Nitrogen precursors and heat to a processing chamber to achieve deposition. A typical buffer layer 112 has a thickness of about 300 Å, which may be deposited at a temperature of about 550° C. for about five minutes. In one embodiment of the present invention, the buffer layer 112 is an aluminum nitride (AlN) layer formed after or during the pretreatment process to the substrate 104.

An n-GaN (n-doped GaN) layer 116 is subsequently deposited on the GaN buffer layer 112. The n-GaN layer 116 may be formed by a HVPE process or a MOCVD process. In one embodiment, n-GaN layer 116 may be deposited at a higher temperature, for example at about 1050° C. The n-GaN layer 116 is relatively thick, with deposition of a thickness on the order of 4 µm requiring about 140 minutes.

An InGaN multi-quantum-well (MQW) layer 120 is subsequently deposited over the n-GaN layer 116. The InGaN MQW layer 120 may have a thickness of about 750 Å and take about about 40 minutes to form at about 750° C.

A p-AlGaN (p-doped AlGaN) layer 124 is deposited over the multi-quantum-well layer 120. The p-AlGaN layer 124 may have a thickness of about 200 Å and take about five minutes at a temperature of about 950° C. to form.

A p-GaN (p-doped GaN) contact layer 128 is then deposited over the p-AlGaN layer 124. The p-GaN contact layer

128 may have a thickness of about 0.4 μm requiring about 25 minutes to form at about 1050° C.

Figure 1B:
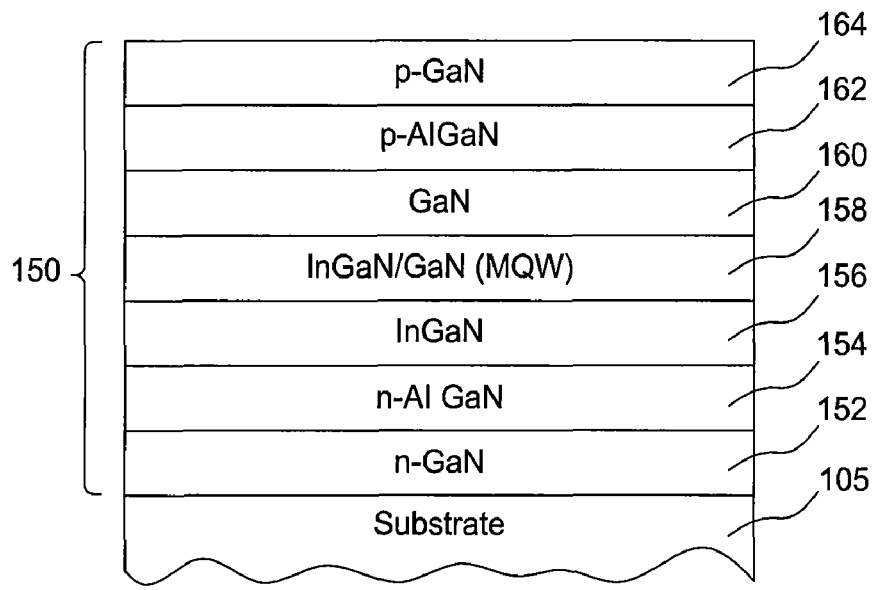
FIG. 1B is a schematic sectional side view of a GaN based LD structure.

FIG. 1B is a schematic sectional side view of a GaN based LD structure 150 formed on an aluminum oxide containing substrate 105. The aluminum oxide containing substrate 105 may be similar to the aluminum oxide containing substrate 104 of FIG. 1A. The substrate 105 may be formed from solid aluminum oxide, such as sapphire (0001). The substrate 105 may also be a composite substrate having a surface containing aluminum oxide for fabricating a compound nitride structure thereon.

In one embodiment, the LD structure 150 is formed on the substrate 105 after a thermal cleaning procedure and a pretreatment process. The thermal cleaning procedure may be performed by exposing the substrate 105 to a cleaning gas mixture comprising ammonia and carrier gas while the substrate 105 is being heated. In one embodiment, the pretreatment process comprises exposing the substrate to a pretreatment gas mixture while the substrate is heated to an elevated temperature. In one embodiment, the pretreatment gas mixture is an etching agent comprising a halogen gas.

The LD structure 150 is a stack of group-III metal nitride layers formed on the substrate 105. The LD structure 150 starts from an n-type GaN contact layer 152. The LD structure 150 further comprises an n-type cladding layer 154. The cladding layer 154 may comprise AlGaN. An undoped guide layer 156 is formed over the cladding layer 154. The guide layer 156 may comprise InGaN. An active layer 158 having a multiquantum well (MQW) structure is formed on the guide layer 156. A undoped guide layer 160 is formed over the active layer 158. A p-type electron block layer 162 is formed over the undoped guide layer 160. A p-type contact GaN layer 164 is formed over the p-type electron block layer 162.

Figure 2:
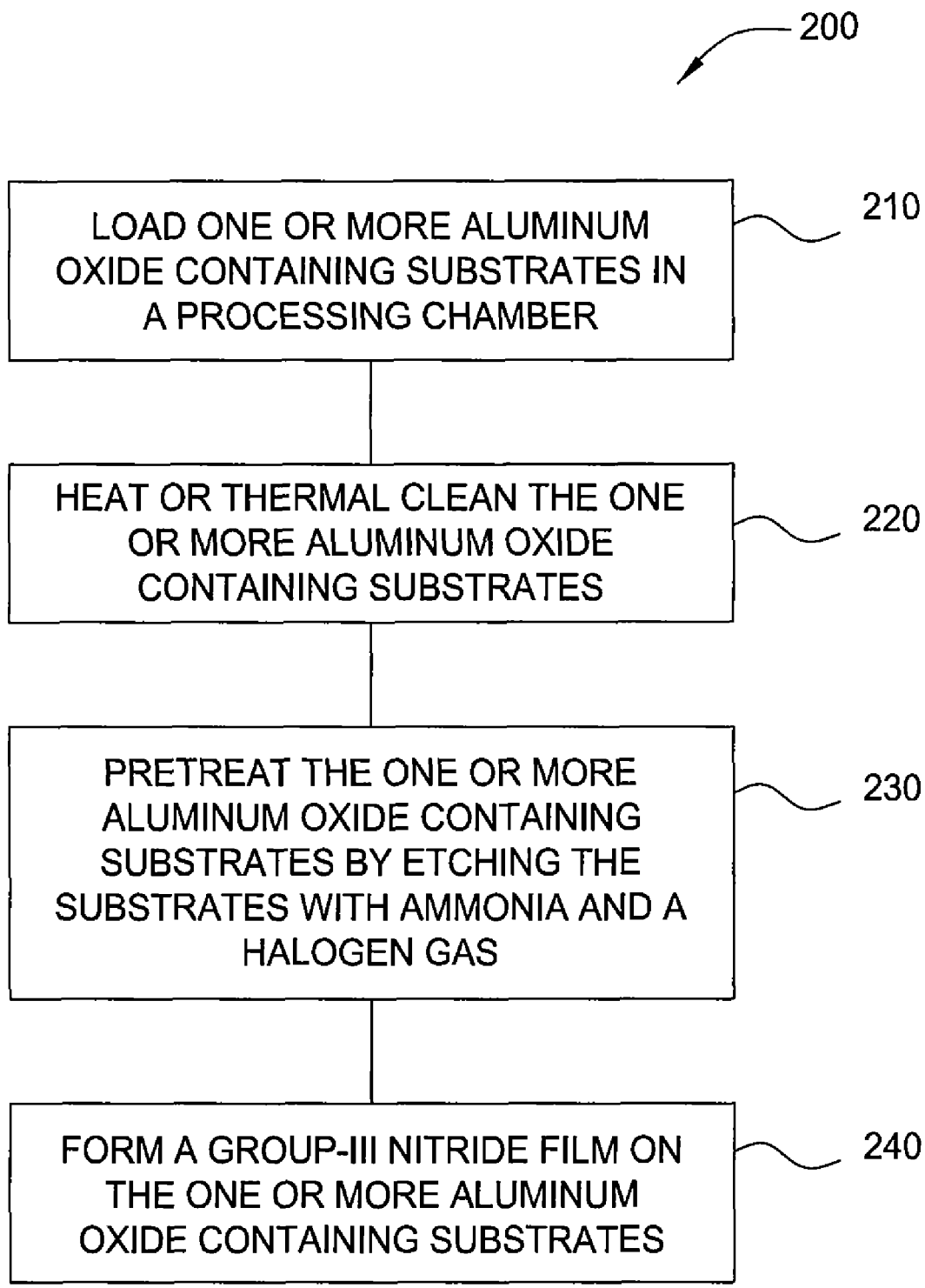
FIG. 2 is a flow diagram of a method for pretreating a substrate according to one embodiment of the present invention.

FIG. 2 is a flow diagram of a method 200 for treating a substrate according to one embodiment of the present invention.

In box 210, one or more aluminum oxide containing substrates are loaded in a processing chamber. In one embodiment, the aluminum oxide containing substrates may be sapphire substrates. In one embodiment, a plurality of sapphire substrates may be positioned in a substrate carrier and transferred into the processing chamber. The substrate carrier is generally adapted to support the substrates during processing. The substrate carrier 616 (FIG. 10) may include one or more recesses within which one or more substrates may be disposed during processing. The substrate carrier may carry six or more substrates. In one embodiment, the substrate carrier carries eight substrates. It is to be understood that more or fewer substrates may be carried on the substrate carrier. Substrate size may range from 50 mm-100 mm in diameter or larger, while substrate carrier size may range from 200 mm-500 mm in diameter. The substrate carrier 616 may be formed from a variety of materials, including SiC or SiC-coated graphite.

In one embodiment, the processing chamber may be designated for cleaning and treating the substrates for subsequent deposition. The cleaned and treated substrates are then transferred to one or more deposition chambers to deposit the layers used to form the LED or LD structures. In another embodiment, the one or more aluminum oxide containing substrates may be loaded in a process chamber wherein at least one layer of films of the LED or LD structure is subsequently formed.

In box 220, the one or more aluminum oxide containing substrates may be heated in the process chamber while a carrier gas is delivered into the processing volume of a process chamber. The carrier gas may comprise nitrogen gas, an inert gas such as argon or helium, or combinations thereof. In one embodiment, a thermal cleaning may be performed to the one or more aluminum oxide containing substrates while heating the substrates. In one embodiment, the thermal cleaning may be performed by flowing a cleaning gas mixture into the processing chamber while heating the one or more substrates to a cleaning temperature. In one embodiment, the cleaning gas mixture comprises ammonia and carrier gas. In one embodiment, the carrier gas comprises nitrogen gas ($N_2$). The cleaning temperature may be between about 900° C. and about 1100° C. In one example, the cleaning temperature may be between about 900° C. and about 1050° C. In another example, the cleaning temperature may be greater than about 900° C. In one example, the thermal cleaning process may be performed by flowing the cleaning gas mixture for about 10 minutes while maintaining the substrate(s) at a temperature of about 1050° C. The thermal cleaning procedure may take additional time, such as on the order of 10 minutes, so that the temperature can be ramped-up and ramped-down. In one embodiment, the temperature ramp-up rate is about 1° C./second to about 5° C./second, or other ramp rate depending on the hardware of the process chamber. In one embodiment, the cleaning gas may be delivered into the process chamber during the temperature ramp-up and ramp-down times.

In box 230, the one or more substrates are exposed to a pretreatment gas mixture at an elevated temperature for a pretreatment to enable high quality GaN film to be formed over the aluminum oxide containing substrates. In one embodiment, the pretreatment process may be performed at a temperature range between about 500° C. to about 1200° C. In one embodiment, the pretreatment process may be performed at a temperature range between about 600° C. to about 1150° C. In one embodiment, the pretreatment process may be performed at a temperature between about 900 and about 1000° C. In one example, the pretreatment process temperature may be greater than about 900° C.

The pretreatment gas mixture may comprise ammonia and a halogen gas selected from the group consisting of fluorine gas ($F_2$), chlorine gas ($Cl_2$), bromine gas ($Br_2$), iodine gas ($I_2$), combinations thereof, and mixtures thereof.

In one embodiment, the pretreatment gas mixture comprises ammonia and chlorine gas and the pretreatment comprises converting the aluminum oxide containing substrates to AlON or AlN by etching the aluminum oxide containing substrates in the presence of the ammonia and chlorine. In one embodiment, exposing the one or more aluminum oxide containing substrates to the pretreatment gas mixture comprises flowing ammonia gas at a flow rate between about 500 sccm to about 9000 sccm and flowing chlorine gas at a flow rate between about 200 sccm to about 1000 sccm. In one embodiment, the pretreatment may be performed for about 1 minute to about 20 minutes.

In box 240, a group-III metal nitride film is formed over a treated surface of the aluminum oxide containing substrate. The group-III metal nitride film may be formed by a HVPE process, a MOCVD process, a CVD process, or a PVD process. In one embodiment, the group-III metal nitride film may be deposited by providing flows of a group-III metal and nitrogen precursors to a processing chamber and using thermal processes to achieve deposition. In one example, the group-III metal precursor may be a metal halide precursor gas, which is discussed below. In one embodiment, the group-III metal nitride film is formed in the same chamber where pretreatment is performed. In another embodiment, the group-III metal nitride film may be formed in a separate process chamber from the process chamber where thermal cleaning and pretreatment are performed.

In one embodiment, a GaN film may be formed during the process of box 240 by a HVPE process. In one embodiment, the HVPE process comprises flowing a gallium containing precursor and a nitrogen source over the one or more substrates at a temperature between about 550° C. to about 1100° C. In one embodiment, the pretreatment process temperature performed at box 230 is less than the HVPE process temperature, such as 100° C. less. In one embodiment, the HVPE process comprises flowing a gallium chloride containing precursor and a nitrogen source over the one or more substrates at a temperature between about 950° C. to about 1100° C. In one embodiment, the gallium containing precursor may be generated by flowing chlorine gas at a flow rate between about 20 sccm to about 150 sccm over liquid gallium maintained at a temperature between 50° C. to about 1000° C. During the deposition processes, the chamber pressure may be maintained between about 10 Torr and about 760 Torr, such as between about 70 Torr and about 550 Torr, for example about 450 Torr, and the chamber wall temperature is maintained at or above about 450° C. The nitrogen source may be ammonia at a flow rate between about 1 SLM to about 20 SLM. In another embodiment, the nitrogen source may be one or more active nitrogen species derived from a remote plasma of a nitrogen-containing material such as nitrogen gas ($N_2$), nitrous oxide ($N_2O$), ammonia ($NH_3$), hydrazine ($N_2H_4$), diimide ($N_2H_2$), hydrazoic acid ($HN_3$), and the like. While the term hydride vapor phase epitaxy (HVPE) is used to describe a type of deposition process described herein, typically the processes described herein use a halogen gas (e.g., $Cl_2$) in place of a hydride containing deposition gas (e.g., HCl) during the deposition process, and thus this term is not intended to limiting as to the scope of the invention described herein.

Figure 10:
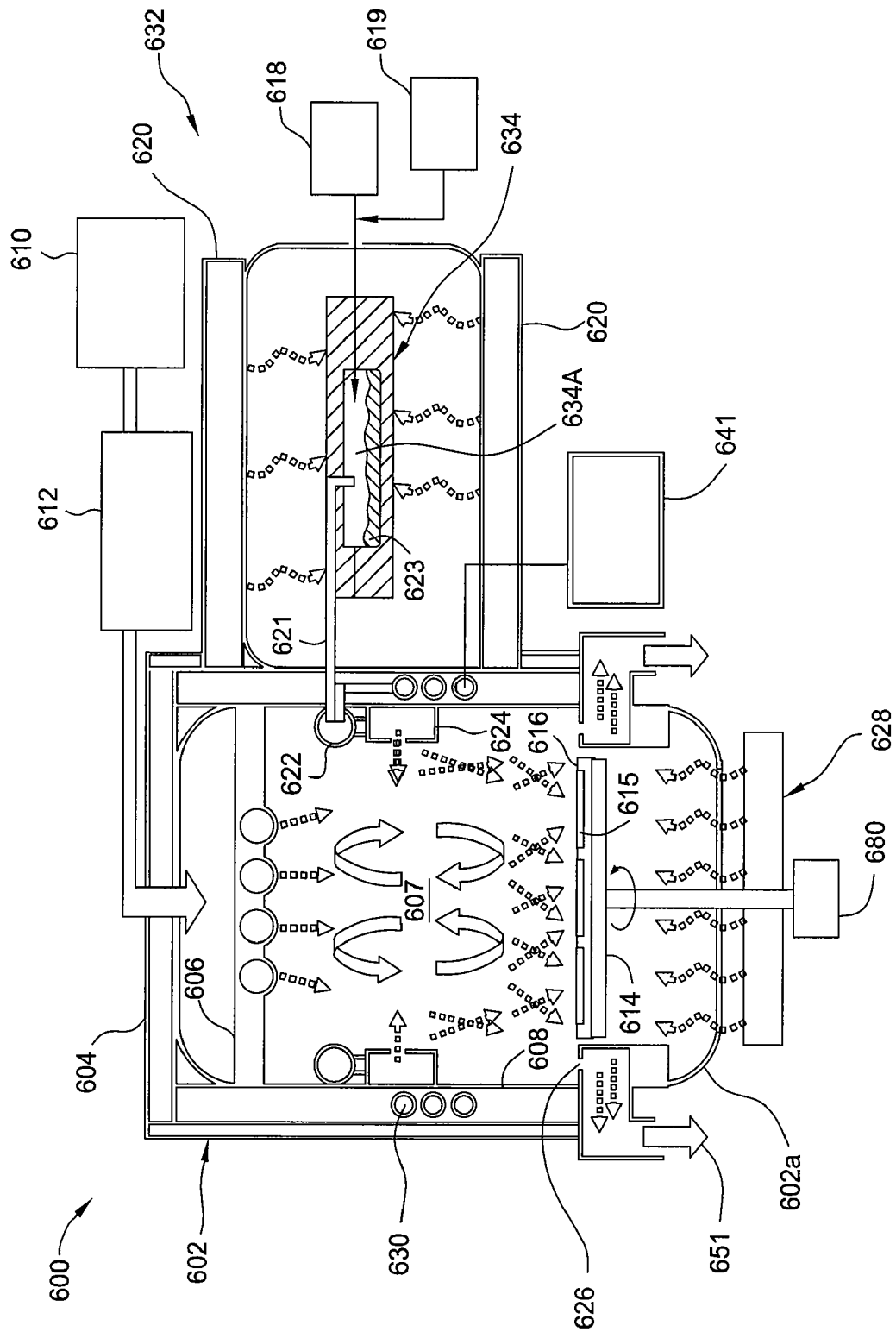
FIG. 10 is a schematic sectional view of an HVPE chamber in accordance with one embodiment of the present invention.

FIG. 10 is a schematic sectional view of an HVPE apparatus 600 which can be used to deposit a metal nitride film, such as the GaN film formed using the processes described in box 240. The HVPE apparatus 600 includes a chamber 602 enclosed by a lid 604. The chamber 602 and the lid 604 define a processing volume 607. A showerhead 606 is disposed in an upper region of the processing volume 607. A susceptor 614 is disposed opposing the showerhead 606 in the processing volume 607. The susceptor 614 is configured to support a plurality of substrates 615 thereon during processing. In one embodiment, the plurality of substrates 615 are disposed on a substrate carrier 616 which is supported by the susceptor 614. The susceptor 614 may be rotated by a motor 680, and may be formed from a variety of materials, including SiC or SiC-coated graphite.

In one embodiment, the HVPE apparatus 600 comprises a heating assembly 628 configured to heat the substrates 615 on the susceptor 614. In one embodiment, chamber bottom 602a is formed from quartz and the heating assembly 628 is a lamp assembly disposed under the chamber bottom 602a to heat the substrates 615 through the quartz chamber bottom 602a. In one embodiment, the heating assembly 628 comprises an array of lamps that are distributed to provide a uniform temperature distribution across the substrates, substrate carrier, and/or susceptor.

The HVPE apparatus 600 further comprises precursor supplying pipes 622, 624 disposed inside the side wall 608 of the chamber 602. The pipes 622 and 624 are in fluid communication with the processing volume 607 and an inlet tube 621 found in a precursor source module 632. The showerhead 606 is in fluid communication with the processing volume 607 and a first gas source 610. The processing volume 607 is in fluid communication with an exhaust 651 through an outlet 626.

The HVPE apparatus 600 further comprises a heater 630 embedded within the walls 608 of the chamber 602. The heater 630 embedded in the walls 608 may provide additional heat if needed during the deposition process. A thermocouple may be used to measure the temperature inside the processing chamber. Output from the thermocouple may be fed back to a controller 641 that controls the temperature of the walls of the chamber 602 by adjusting the power delivered to the heater 630 (e.g., resistive heating elements) based upon the reading from a thermocouple (not shown). For example, if the chamber is too cool, the heater 630 will be turned on. If the chamber is too hot, the heater 630 will be turned off. Additionally, the amount of heat provided from the heater 630 may be controlled so that the amount of heat provided from the heater 630 is minimized.

Processing gas from the first gas source 610 is delivered to the processing volume 607 through the gas distribution showerhead 606. In one embodiment, the first gas source 610 may comprise a nitrogen containing compound. In one embodiment, the first gas source 610 is configured to deliver a gas that comprises ammonia or nitrogen. In one embodiment, an inert gas such as helium or diatomic nitrogen may be introduced as well either through the gas distribution showerhead 606 or through the pipe 624, disposed on the walls 608 of the chamber 602. An energy source 612 may be disposed between the first gas source 610 and the gas distribution showerhead 606. In one embodiment, the energy source 612 may comprise a heater or a remote RF plasma source. The energy source 612 may provide energy to the gas delivered from the first gas source 610, so that radicals or ions can be formed, so that the nitrogen in the nitrogen containing gas is more reactive.

The source module 632 comprises a halogen gas source 618 connected to a well 634A of a source boat 634 and an inert gas source 619 connected to the well 634A. A source material 623, such as aluminum, gallium or indium, is disposed in the well 634A. A heating source 620 surrounds the source boat 634. An inlet tub 621 connects the well 634A to the processing volume 607 via the pipes 622, 624.

In one embodiment, during processing a halogen gas (e.g., $Cl_2$, $Br_2$, $F_2$, or $I_2$) is delivered from the halogen gas source 618 to the well 634A of the source boat 634 to create a metal halide gas, or metal halide precursor gas. In one embodiment, the metal halide gas is a group-III metal halide gas, such as gallium chloride (e.g., GaCl, $GaCl_3$), indium chloride (e.g., $ICl_3$) or aluminum chloride (e.g., $AlCl_3$). The interaction of the halogen gas and the solid or liquid source material 623 allows a metal halide precursor to be formed. The source boat 634 may be heated by the heating source 620 to heat the source material 623 and allow the metal halide precursor to be formed. The metal halide precursor is then delivered to the processing volume 607 of the HVPE apparatus 600 through an inlet tube 621. In one embodiment, an inert gas (e.g., Ar, He, $N_2$) delivered from the inert gas source 619 is used to carry, or push, the metal halide precursor formed in the well 634A through the inlet tube 621 and pipes 622 and 624 to the processing volume 607 of the HVPE apparatus 600. A nitrogen-containing precursor gas (e.g., ammonia ($NH_3$), $N_2$) may be introduced into the processing volume 607 through the showerhead 606, while the metal halide precursor is also provided to the processing volume 607, so that a metal nitride layer can be formed on the surface of the substrates 615 disposed in the processing volume 607.

Figure 3:
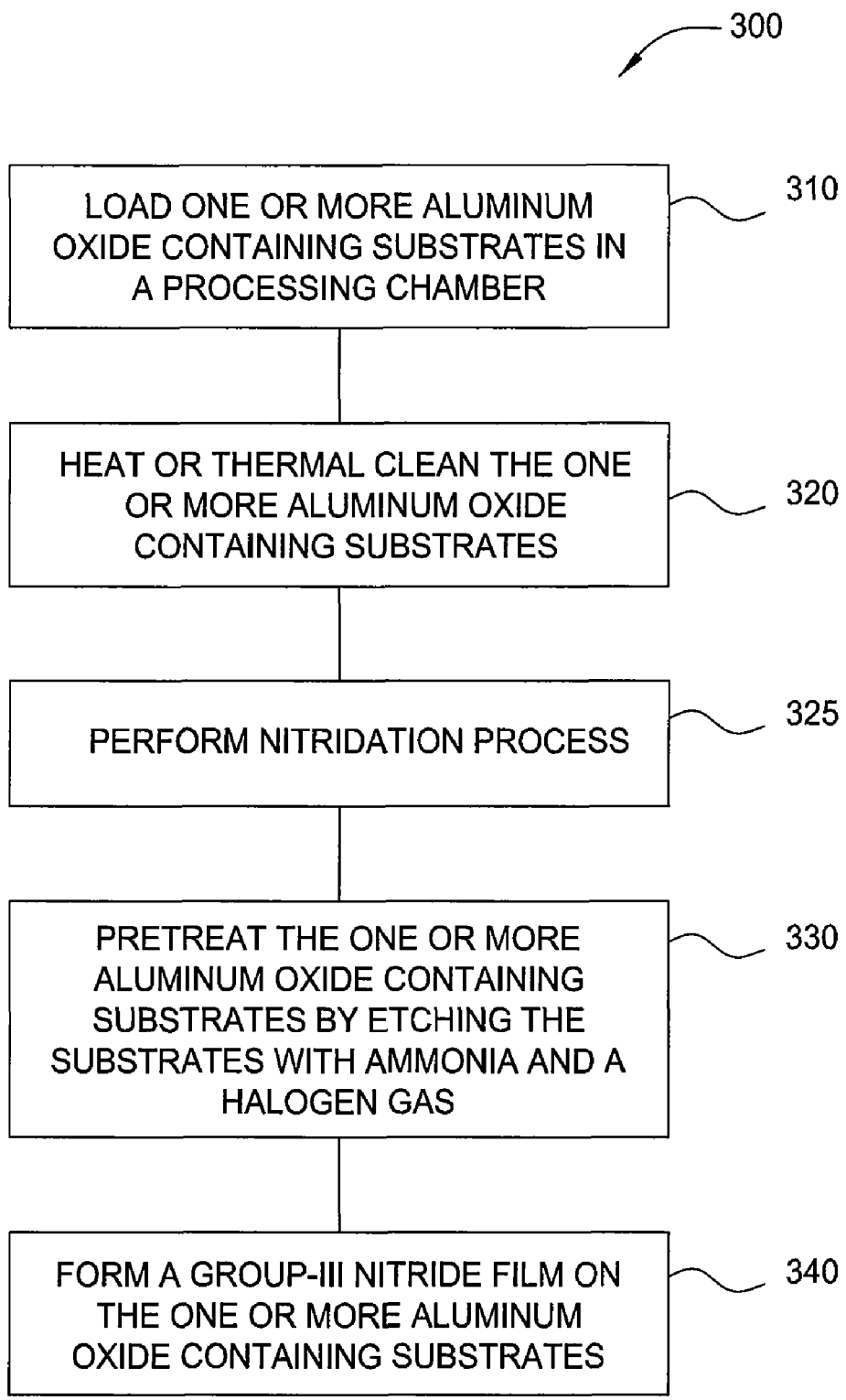
FIG. 3 is a flow diagram of a method according to one embodiment of the present invention.

FIG. 3 is a flow diagram of a method 300 according to one embodiment of the present invention. Method 300 comprises performing a nitridation process prior to the pretreatment to one or more aluminum oxide containing substrates.

In box 310, one or more aluminum oxide containing substrates are loaded in a processing chamber. In one example, the processing chamber is similar to the HVPE apparatus 600, described above. In one embodiment, the aluminum oxide containing substrates are sapphire substrates.

In box 320, the one or more aluminum oxide containing substrates are heated or thermally cleaned in a process similar to the process described above with box 220 of the method 200.

In box 325, a nitridation process is performed on the one or more aluminum oxide containing substrates. During nitridation, the one or more aluminum oxide containing substrates may be heated to a temperature between about 850° C. to about 1100° C. while flowing a nitriding gas mixture to the process chamber for about 5 minutes to about 15 minutes. In one embodiment, the nitriding gas mixture comprises ammonia and a carrier gas. In one embodiment, the carrier gas is nitrogen gas. In one embodiment, the total flow rate of the nitriding gas mixture is between about 3 SLM to about 16 SLM.

In box 330, the substrates are exposed to a pretreatment gas mixture at an elevated temperature to enable a high quality GaN film to be formed over the aluminum oxide containing substrate after the nitriding process. In one embodiment, the pretreatment process comprises converting the aluminum oxide containing substrates to AlON or AlN by etching the aluminum oxide containing substrates in the presence of the ammonia and chlorine. The process in box 330 is similar to the process described above with box 230 of the method 200.

In box 340, a group-III metal nitride film is forming over the treated surface of the aluminum oxide containing substrates. The processes performed in box 340 may be similar to the processes described above in conjunction with box 240 of the method 200.

Figure 4:
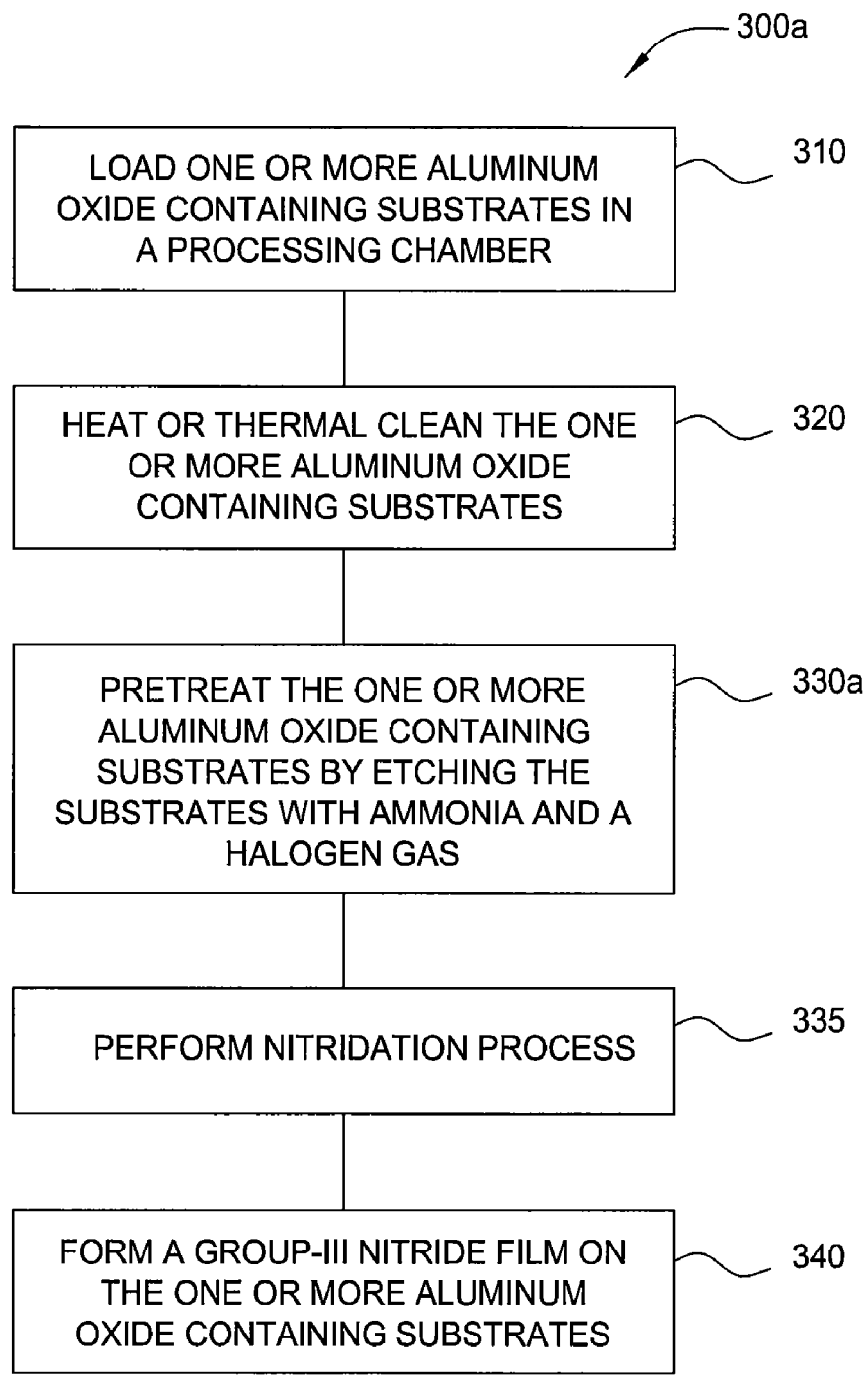
FIG. 4 is a flow diagram of a method according to one embodiment of the present invention.

FIG. 4 is a flow diagram of a method 300a according to one embodiment of the present invention. The method 300a is similar to the method 300 except that a nitriding process is performed after a pretreatment.

In box 310, one or more aluminum oxide containing substrates are loaded in a processing chamber. In one example, the processing chamber is similar to the HVPE apparatus 600, described above. In one embodiment, the aluminum oxide containing substrates are sapphire substrates.

In box 320, similar to the process performed in box 220 of method 200, the one or more aluminum oxide containing substrates may be heated or a thermal cleaning may be performed to the one or more aluminum oxide containing substrates during heating.

In box 330a, similar to the pretreatment performed in box 230 of method 200, the one or more substrates are exposed to a pretreatment gas mixture at an elevated temperature to enable high quality GaN film to be formed over the aluminum oxide containing substrates. Just like in box 330 and box 230, a layer of AlON or AlN is formed on the aluminum oxide containing substrates by etching the aluminum oxide containing substrates in the presence of the ammonia and chlorine.

In box 335, after pretreatment, a nitridation process is performed over the one or more aluminum oxide containing substrates. The nitridation process in box 335 is similar to the nitridation process of 325 of method 300. During nitridation, the one or more aluminum oxide containing substrates may be heated to a temperature between about 850° C. to about 1100° C. while flowing a nitriding gas mixture to the process chamber for a bout 5 minutes to about 15 minutes.

In box 340, a group-III metal nitride film is formed over the treated surface of the aluminum oxide containing substrate, similar to the group-III metal nitride film forming process of box 240 of method 200.

Figure 5:
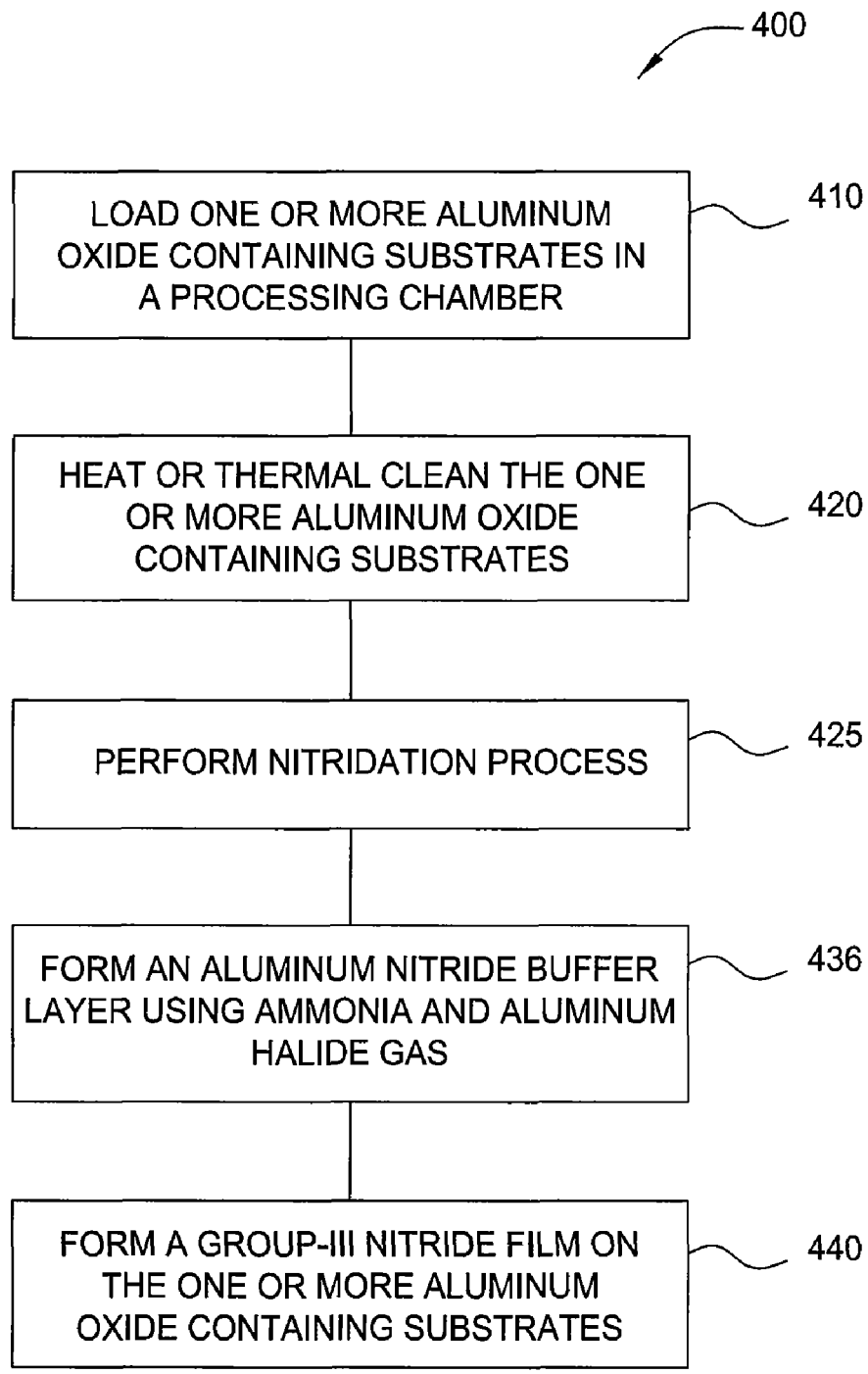
FIG. 5 is a flow diagram of a method according to one embodiment of the present invention.

FIG. 5 is a process flow diagram illustrating a method 400 according to one embodiment of the present invention. The method 400 discloses treatments to one or more aluminum oxide containing substrates prior to forming a GaN film for a LED or LD structure. The method 400 comprises thermal cleaning, nitriding, and forming a buffer layer on the one or more aluminum oxide containing substrates prior to forming a group-III metal nitride film for a LED or LD structure.

In box 410, one or more aluminum oxide containing substrates are loaded in a processing chamber. In one example, the processing chamber is similar to the HVPE apparatus 600 described above.

In box 420, the one or more aluminum oxide containing substrates are heated and/or cleaned using processes similar to the thermal cleaning process described in box 220 of method 200.

In box 425, a nitriding process is then performed on the one or more aluminum oxide containing substrates by exposing the one or more aluminum oxide containing substrates to a nitriding gas mixture while heating the substrate. The nitriding process may be similar to the nitriding process described in box 325 of method 300.

In box 436, a buffer layer is then formed on the one or more aluminum oxide containing substrates. The buffer layer may comprise aluminum nitride (AlN) and/or aluminum oxynitride (AlON), or gallium nitride (GaN).

In one embodiment, the buffer layer comprises AlN formed by HVPE using ammonia as a nitrogen source, and an aluminum halide gas generated by flowing a halogen over an aluminum metal source. For example, the buffer layer may be formed using the HVPE apparatus 600 shown in FIG. 6. The buffer layer may be formed by generating a metal halide precursor, such as an aluminum chloride precursor, and flowing the metal halide precursor and a nitrogen-containing precursor gas to the processing region 607 in the process chamber 602 while maintaining the one or more substrates at a temperature between about 550° C. to about 950° C. In one embodiment, the aluminum chloride precursor is generated by flowing chlorine gas ($Cl_2$) over solid aluminum at a flow rate between about 70 sccm to about 140 sccm with the solid aluminum maintained at a temperature between about 50° C. to about 650° C. In one embodiment, the aluminum source material is maintained between about 450° C. to about 650° C. In one embodiment, the aluminum source material is disposed in a location remote of the substrate processing region, the processing temperature of the aluminum source may be maintained between about 50° C. to about 150° C.

In one embodiment, the buffer layer may be formed by flowing a gallium chloride precursor and a nitrogen source to the process chamber while heating the one or more substrates to a temperature between about 550° C. to about 1100° C. The cleaning temperature may be between about 900 and about 1100° C. In one embodiment, the buffer layer may be formed by flowing a gallium chloride precursor and a nitrogen source to the process chamber while heating the one or more substrates to a temperature between about 950 and about 1100° C. In one example, the temperature is maintained at about 1050° C. In one embodiment, the gallium chloride precursor is generated by flowing chlorine gas over gallium at a flow rate between about 5 sccm to about 300 sccm with gallium maintained at a temperature between about 550° C. to about 1000° C. In one embodiment, the gallium chloride precursor is generated by flowing hydrogen chloride gas over gallium at a flow rate between about 5 sccm to about 300 sccm with gallium maintained at a temperature between about 550° C. to about 1000° C.

In one embodiment, the nitrogen source may be ammonia. In another embodiment, the nitrogen source may be one or more active nitrogen species derived from a remote plasma of a nitrogen-containing material such as nitrogen gas ($N_2$), nitrous oxide ($N_2O$), ammonia ($NH_3$), hydrazine ($N_2H_4$), diimide ($N_2H_2$), hydrazoic acid ($HN_3$), and the like. In one embodiment, the flow rate of nitrogen source may be between about 3000 sccm to about 9000 sccm.

In box 440, a group-III metal nitride film is formed over treated surface of the aluminum oxide containing substrate, similar to the group-III metal nitride film forming process of box 240 of method 200.

Figure 6:
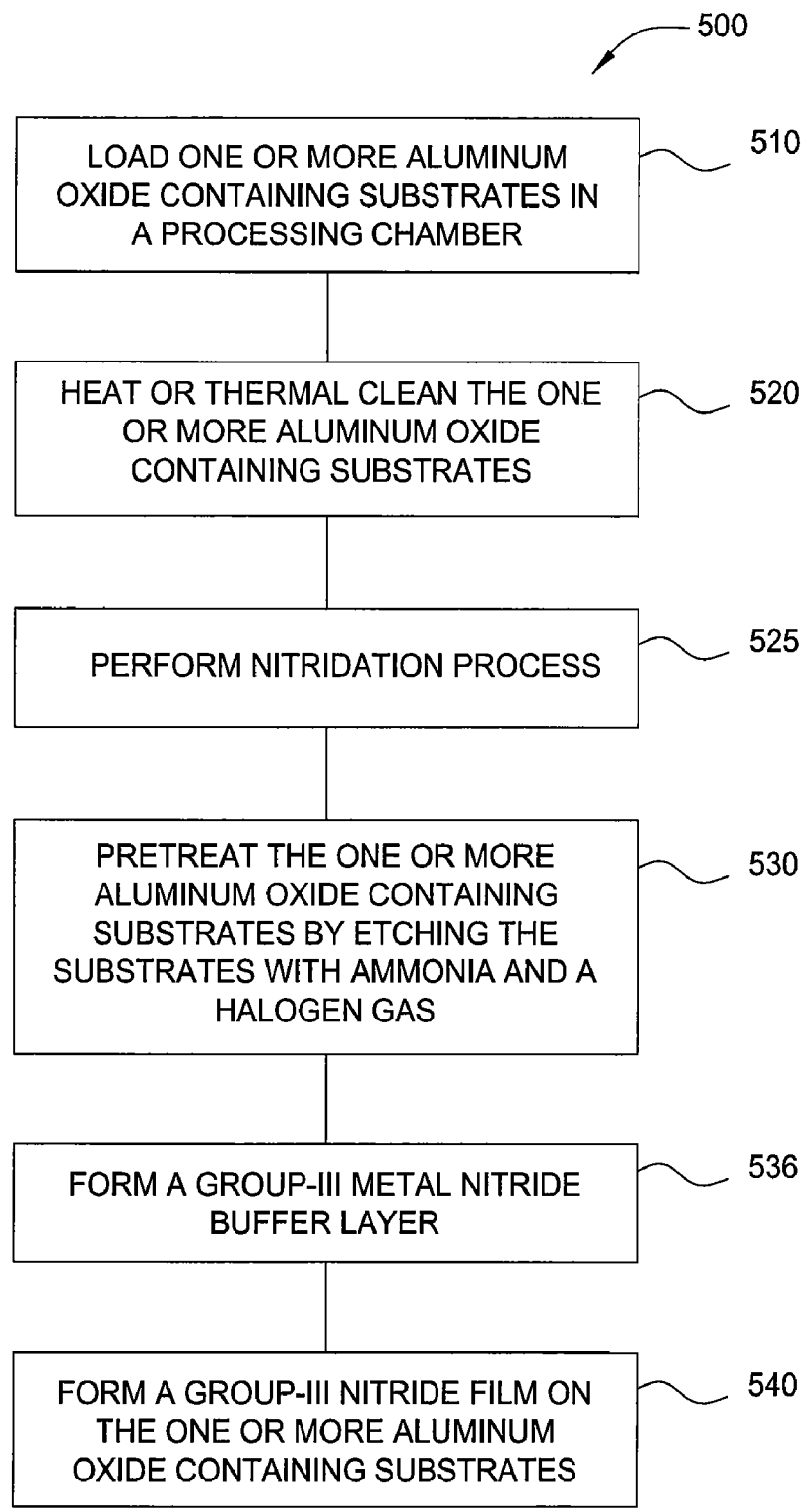
FIG. 6 is a flow diagram of a method according to one embodiment of the present invention.

FIG. 6 is a process flow diagram illustrating a method 500 according to one embodiment of the present invention. The method 500 discloses treatments to one or more aluminum oxide containing substrates prior to forming a GaN film for a LED or LD structure. The method 500 comprises thermal cleaning, nitriding, pretreating, and forming a buffer layer on the one or more aluminum oxide containing substrates prior to forming a group-III metal nitride film for a LED or LD structure.

In box 510, the one or more aluminum oxide containing substrates are positioned in a processing chamber. In one example, the processing chamber is similar to the HVPE apparatus 600 described above.

In box 520, the one or more aluminum oxide containing substrates are heated and/or cleaned using processes similar to the thermal cleaning process described in box 220 of method 200.

In box 525, a nitriding process is then performed on the one or more aluminum oxide containing substrates by exposing the one or more aluminum containing substrate to a nitriding gas mixture while heating the substrate. The nitriding process may be similar to the nitriding process described in box 325 of method 300.

In box 530, the one or more substrates are exposed to a pretreatment gas mixture at an elevated temperature for a pretreatment to enable high quality GaN film to be formed over the aluminum oxide containing substrate. Just like in box 330 and box 230, a layer of AlON or AlN is formed on the aluminum oxide containing substrates by etching the aluminum oxide containing substrates in the presence of the ammonia and chlorine.

In box 536, a buffer layer is then formed on the pre-treated aluminum oxide containing substrates. The buffer layer may comprise aluminum nitride (AlN) and/or aluminum oxynitride (AlON), or gallium nitride. In one embodiment, the buffer layer is formed by one of the processes described above with box 436 of the method 400.

In box 540, a group-III metal nitride film is formed over the treated surface of the aluminum oxide containing substrate, similar to the group-III metal nitride film forming process of box 240 of method 200.

Figure 7:
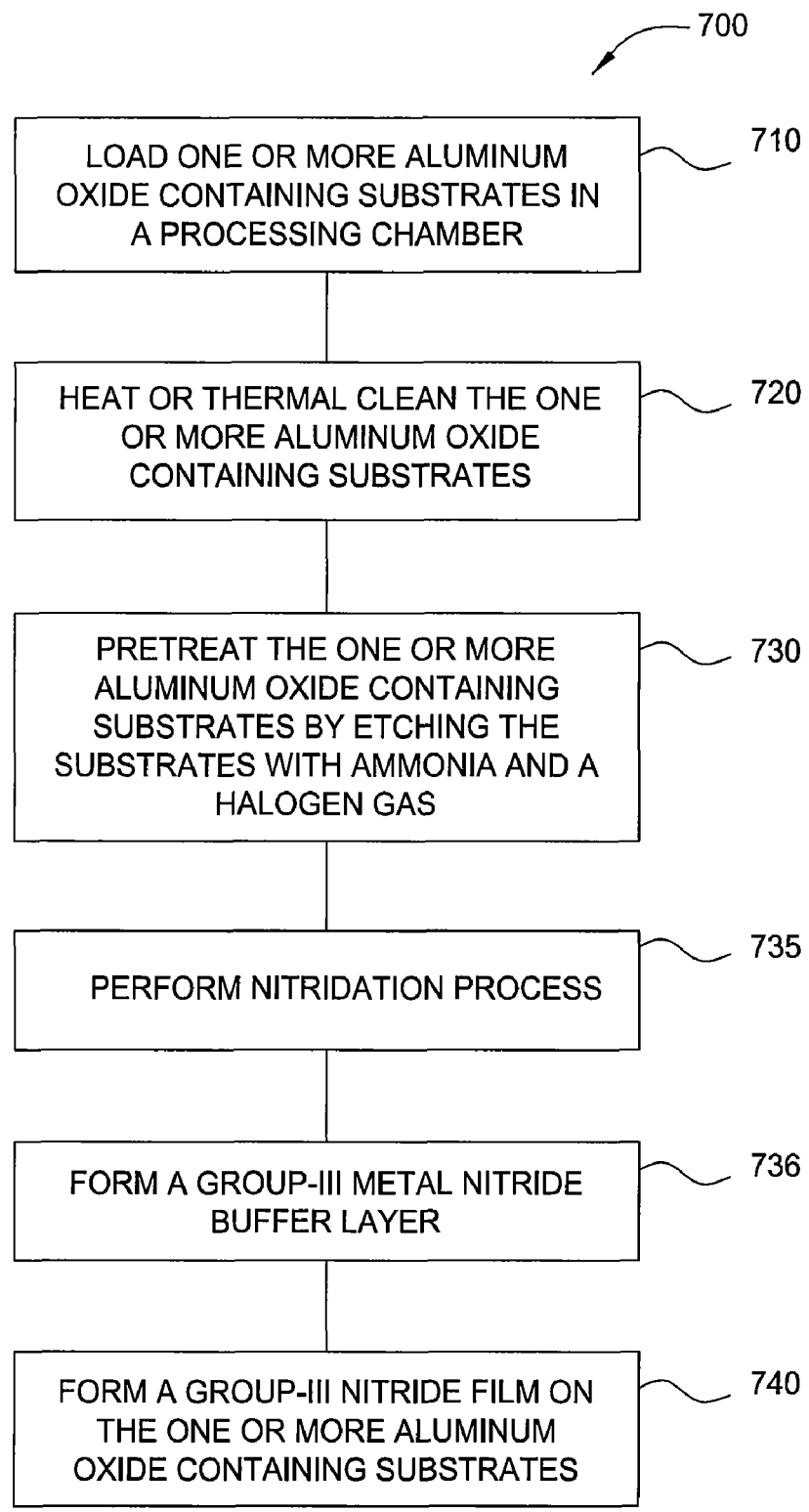
FIG. 7 is a flow diagram of a method according to one embodiment of the present invention.

FIG. 7 is a process flow diagram illustrating a method 700 according to one embodiment of the present invention. The method 700 is similar to the method 500 of FIG. 6 except a nitridation process is performed after the pretreatment process.

In box 710, the one or more aluminum oxide containing substrates are positioned in a processing chamber. In one example, the processing chamber is similar to the HVPE apparatus 600 described above.

In box 720, the one or more aluminum oxide containing substrates are heated and/or cleaned using processes similar to the thermal cleaning process described in box 220 of method 200.

In box 730, the one or more substrates are exposed to a pretreatment gas mixture at an elevated temperature for a pretreatment to enable high quality GaN film to be formed over the aluminum oxide containing substrate, similar to the pretreatment process described in box 530 of method 500.

In box 735, a nitriding process is then performed on the one or more aluminum oxide containing substrates by exposing the one or more aluminum oxide containing substrate to a nitriding gas mixture while heating the substrate. The nitriding process may be similar to the nitriding process described in box 325 of method 300.

In box 736, a buffer layer is then formed on the one or more aluminum oxide containing substrates. The buffer layer may comprise aluminum nitride (AlN) and/or aluminum oxynitride (AlON), or gallium nitride. The buffer layer may be formed in a similar way as described in box 536 of method 500.

In box 740, a group-III metal nitride film is formed over the treated surface of the aluminum oxide containing substrate, similar to the group-III metal nitride film forming process of box 240 of method 200.

Figure 8:
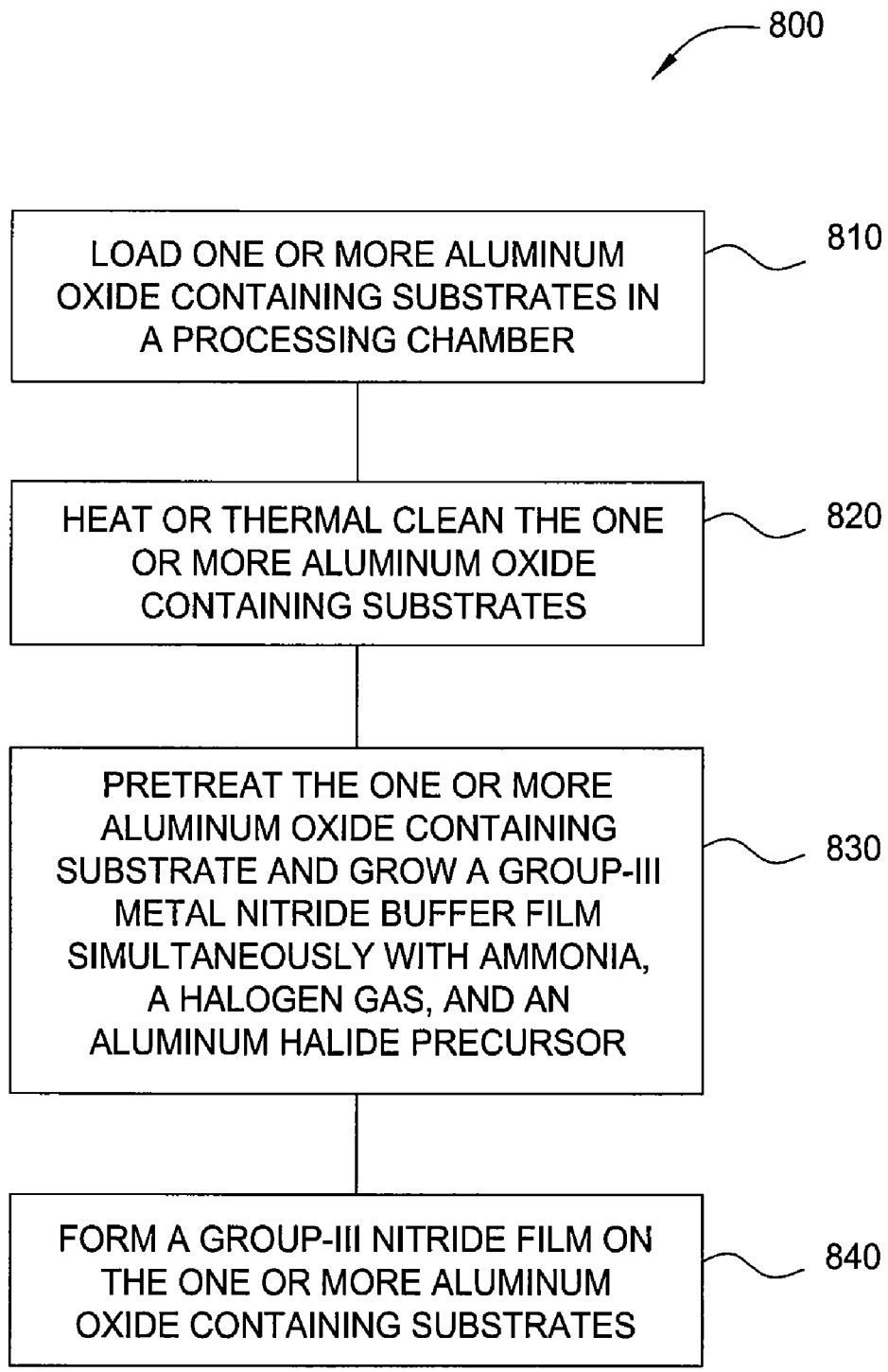
FIG. 8 is a flow diagram of a method according to one embodiment of the present invention.

FIG. 8 is a flow diagram of a method 800 according to one embodiment of the present invention. The method 800 discloses treatments to one or more aluminum oxide containing substrates prior to forming a GaN film for a LED or LD structure. The method 800 comprises a combined process of pretreating and forming a buffer layer on the one or more aluminum oxide containing substrates prior to forming a group-III metal nitride film for a LED or LD structure.

In box 810, one or more aluminum oxide containing substrates are loaded in a processing chamber. In one example, the process is performed in a chamber similar to the HVPE apparatus 600 discussed above.

In box 820, the one or more aluminum oxide containing substrates goes through a heating or a thermal cleaning process similar to the thermal cleaning process described in box 220 of method 200.

In box 830, the one or more substrates are exposed to a pretreatment/buffer gas mixture for a pretreatment to the aluminum oxide containing surface and forming a buffer layer. In one embodiment, the pretreatment/buffer gas mixture comprises a nitrogen source, a halogen gas, and an aluminum or gallium containing precursor. The nitrogen source may be ammonia. The halogen gas may be selected from the group consisting of fluorine gas, chlorine gas, bromine gas, iodine gas, combinations thereof, and mixtures thereof. The aluminum containing precursor may be aluminum chloride precursor generated from flowing chlorine gas over solid aluminum maintained at high temperature, similar to the aluminum precursor described in description of box 536.

In box 840, a group-III metal nitride film is forming over treated surface of the aluminum oxide containing substrate, similar to the group-III metal nitride film forming process of box 240 of method 200.

As discussed above, the methods described according to embodiments of the present invention may be performed in a single chamber, or performed in two or more changes in a cluster tool.

In one embodiment, when processes of a method are performed in a single chamber, ammonia and/or nitrogen gas may be flown constantly during the process during temperature ramp-up, temperature ramp-down, thermal cleaning, pretreatment, nitridation, buffer layer deposition, and GaN deposition.

Figure 9:
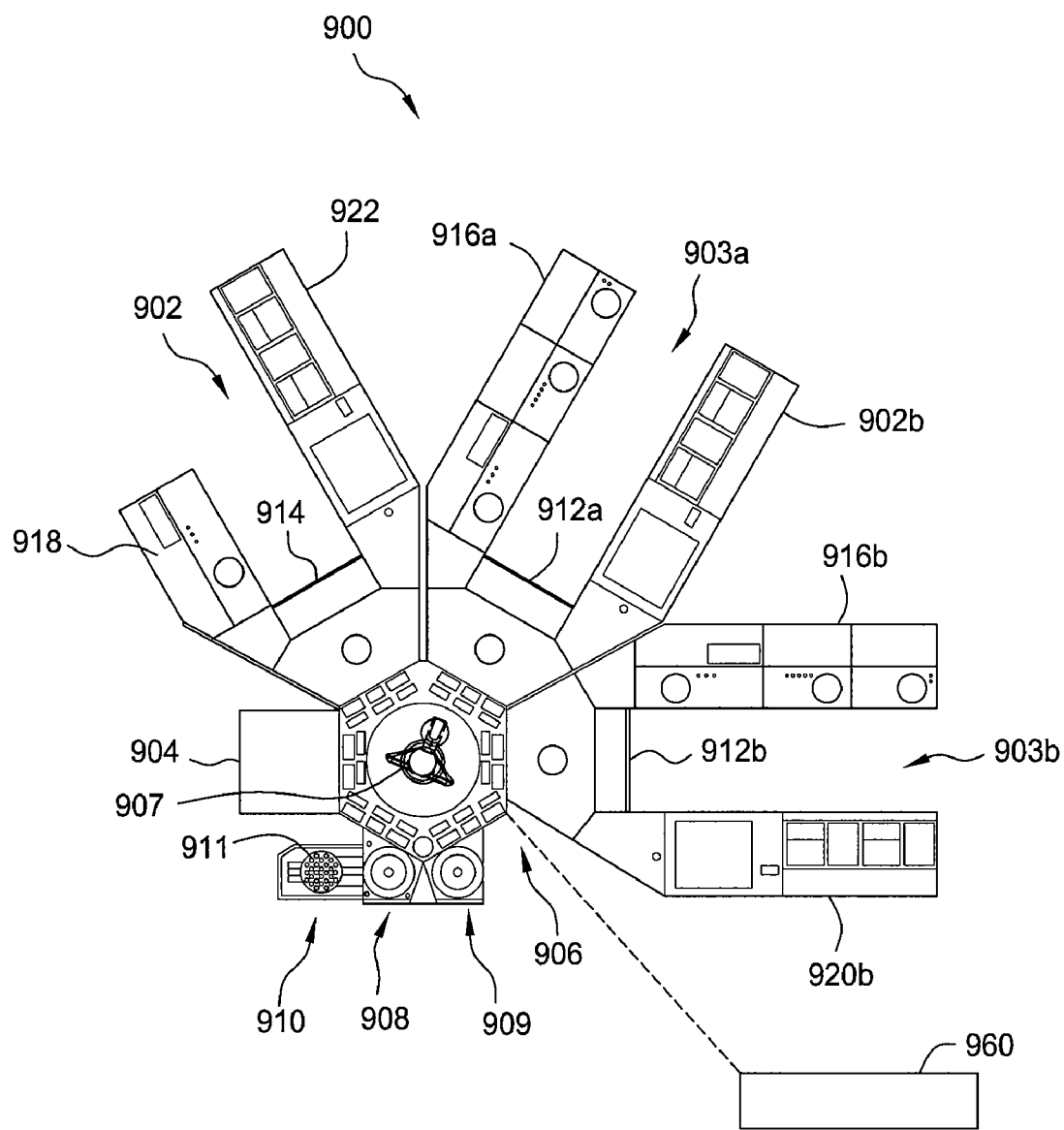
FIG. 9 is a cluster tool according to one embodiment of the present invention.

In another embodiment, one or more substrates may be treated in a chamber first, then move to a different chamber within a tool for subsequent processing. FIG. 9 is a cluster tool 900 may be used in a process according to one embodiment of the present invention. The cluster tool 900 is configured to form nitride compound structures for LED and/or LD.

In one embodiment, the cluster tool 900 comprises one HVPE chamber 902 and multiple MOCVD chambers 903a and 903b connected to a transfer chamber 906 for fabricating compound nitride semiconductor devices according to embodiments described herein. Although one HVPE chamber 902 and two MOCVD chambers 903a and 903b are shown, it should be understood that any combination of one or more MOCVD chambers with one or more HVPE chambers may also be coupled with the transfer chamber 906. For example, in one embodiment, the cluster tool 900 may comprise 3 MOCVD chambers. In another embodiment, the processes described herein may be performed in a single MOCVD chamber. It should also be understood that although a cluster tool is shown, the embodiments described herein may also be performed using a linear processing system.

In one embodiment, an additional chamber 904 is coupled with the transfer chamber 906. The additional chamber 904 may be an MOCVD chamber, an HVPE chamber, a metrology chamber, a degassing chamber, an orientation chamber, a cool down chamber, a pretreatment/preclean chamber, a post-anneal chamber, or the like. In one embodiment, the transfer chamber 906 is six-sided and hexagonal in shape with six positions for process chamber mounting. In another embodiment, the transfer chamber 906 may have other shapes and have five, seven, eight, or more sides with a corresponding number of process chamber mounting positions.

The HVPE chamber 902 is adapted to perform HVPE processes in which gaseous metal halides are used to epitaxially grow thick layers of compound nitride semiconductor materials on heated substrates. The HVPE chamber 902 comprises a chamber body 914 where a substrate is placed to undergo processing, a chemical delivery module 918 from which gas precursors are delivered to the chamber body 914, and an electrical module 922 that includes the electrical system for the HVPE chamber of the cluster tool 900. In one embodiment, the HVPE chamber 902 may be similar to the HVPE apparatus 600 described in FIG. 10.

Each MOCVD chamber 903a, 903b comprises a chamber body 912a, 912b forming a processing region where a substrate is placed to undergo processing, a chemical delivery module 916a, 916b from which gases such as precursors, purge gases, and cleaning gases are delivered to the chamber body 912a, 912b and an electrical module 920a, 920b for each MOCVD chamber 903a, 903b that includes the electrical system for each MOCVD chamber of the cluster tool 900. Each MOCVD chamber 903a, 903b is adapted to perform CVD processes in which metalorganic precursors (e.g., TMG, TMA) react with metal hydride elements to form thin layers of compound nitride semiconductor materials.

The cluster tool 900 further comprises a robot assembly 907 housed in the transfer chamber 906, a load lock chamber 908 coupled with the transfer chamber 906, a batch load lock chamber 909, for storing substrates, coupled with the transfer chamber 706. The cluster tool 900 further comprises a load station 910, for loading substrates, coupled with the load lock chamber 908. The robot assembly 907 is operable to pick up and transfer substrates between the load lock chamber 908, the batch load lock chamber 909, the HVPE chamber 902, and the MOCVD chambers 903a, 903b. In one embodiment, the load station 910 is an automatic loading station configured to load substrates from cassettes to substrate carriers or to the load lock chamber 908 directly, and to unload the substrates from substrate carriers or from the load lock chamber 908 to cassettes.

The transfer chamber 906 may remain under vacuum and/or at a pressure below atmosphere during the process. The vacuum level of the transfer chamber 906 may be adjusted to match the vacuum level of corresponding processing chambers. In one embodiment, the transfer chamber 906 maintains an environment having greater than 90% $N_2$ for substrate transfer. In another embodiment, the transfer chamber 906 maintains an environment of high purity $NH_3$ for substrate transfer. In one embodiment, the substrate is transferred in an environment having greater than 90% $NH_3$. In another embodiment, the transfer chamber 906 maintains an environment of high purity $H_2$ for substrate transfer. In one embodiment, the substrate is transferred in an environment having greater than 90% $H_2$.

The cluster tool 900 further comprises a system controller 960 which controls activities and operating parameters. The system controller 960 includes a computer processor and a computer-readable memory coupled to the processor. The processor executes system control software, such as a computer program stored in memory.

In one embodiment, one of the processing chamber 902, 903a, 903b, or 904 is configured to clean and pretreat the substrates according to methods described above prior to forming LED/LD structures. In one embodiment, the substrates may be cleaned, pretreated, nitriding, and/or covered with a buffer layer in the HVPE chamber 902, then moved to processing chambers 903a, 903b, or 904 for forming group-III metal nitride layers for the LED/LD structure. In another embodiment, one or more LED/LD structure layers may be formed in the processing chamber 902 after the substrates are cleaned, pretreated, nitriding, and/or covered with a buffer layer in the HVPE chamber 902, then moved to processing chambers 903a, 903b, or 904 for forming subsequent layers for the LED/LD structure.

During the process of fabricating LED or LD structures, a plurality of sapphire substrates are first loaded into a processing chamber. The sapphire substrates are then heated at a temperature ramp-up rate between about 1° C./second to about 5° C./second. Ammonia is flow to the process chamber at a flow rate between about 3000 sccm to about 9000 sccm during temperature ramp-up.

A thermal cleaning is then performed to the sapphire substrates at temperature between 850° C. to about 1100° C. by flowing ammonia and nitrogen carrier gas for about 5 to 15 minutes. The ammonia flow rate may between about 1 SLM to about 10 SLM.

A pretreatment process is then performed to the sapphire substrates within a temperature range between about 625° C. to about 1150° C. by flowing chlorine gas at a flow rate between 200 sccm to about 1000 sccm and ammonia at a flow rate between 500 sccm to about 12,000 sccm.

A GaN film is then formed over the sapphire substrates by a HVPE process at a temperature between about 700° C. to about 1100° C. by flowing a gallium containing precursor and ammonia. The gallium containing precursor is generated by flowing chlorine gas at a flow rate between about 20 sccm to about 150 sccm over solid gallium maintained at a temperature between 550° C. to about 1100° C. Ammonia is flown to the processing chamber at a flow rate with in the range between about 3 SLM to about 25 SLM. The GaN has a growth rate between about 0.3 micron/hour to about 150 micron/hour.

Optionally, a nitridation process may be performed prior to one or more of the previous process steps by flowing ammonia and nitrogen carrier gas for about 5 to 15 minutes and heating or maintaining the temperature of the sapphire substrates at a temperature between 850° C. to about 1100° C. The ammonia and nitrogen flow rate may between about 100 sccm to about 500 sccm.

The pressure in the processing chamber during the above cleaning, pretreating, nitridation and deposition may between about 70 Torr to about 760 Torr.

It should be noted that active gases described above in association with embodiments of the present invention, such as group-III metal precursors, metal halide gases, halogen gases, ammonia gas, chlorine gas, HCl gas, may be diluted by an inert gas during processing. Suitable inert gas may be argon, helium, nitrogen, or combinations thereof.

While the foregoing is directed to embodiments of the present invention, other and further embodiments of the invention may be devised without departing from the basic scope thereof, and the scope thereof is determined by the claims that follow.

What is claimed is:

1. A method for forming a group-III metal nitride film, comprising:
    heating one or more sapphire substrates to a pretreatment temperature;
    exposing a surface of each of the one or more sapphire substrates to a pretreatment gas mixture when the surface is at the pretreatment temperature to form a pretreated surface, wherein the pretreatment gas mixture comprises ammonia ($NH_3$), a group-III metal halide gas and an etchant containing gas that comprises a halogen gas, and exposing the surface of the one or more sapphire substrates comprises forming a region of the pretreated surface that comprises aluminum oxynitride or aluminum nitride; and
    forming a group III metal nitride layer over the pretreated surface.

2. The method of claim 1, wherein the halogen gas is chlorine ($Cl_2$).

3. The method of claim 1, wherein the group-III metal halide gas is formed by exposing a metal source to a first processing gas comprising chlorine ($Cl_2$), and the metal source comprises aluminum.

4. The method of claim 1, wherein forming the group-III metal nitride layer comprises exposing the one or more sapphire substrates to a nitrogen containing precursor gas and a gallium chloride containing gas.

5. The method of claim 1, further comprising delivering a nitriding gas mixture that comprises ammonia ($NH_3$) while the temperature of the one or more sapphire substrates is heated to the pretreatment temperature.

6. A method for forming a group-III metal nitride film, comprising:
    heating one or more sapphire substrates to a pretreatment temperature;
    exposing a surface of each of the one or more sapphire substrates to a pretreatment gas mixture when the surface is at the pretreatment temperature to form a pretreated surface, wherein the pretreatment gas mixture comprises ammonia ($NH_3$) and an etchant containing gas that comprises a halogen gas, and exposing the surface of the one or more sapphire substrates comprises forming a region of the pretreated surface that comprises aluminum oxynitride or aluminum nitride;
    exposing a surface of the one or more sapphire substrates to a nitriding gas mixture for a first period of time; and
    forming a group III metal nitride layer over the pretreated surface.

7. The method of claim 6, wherein the halogen gas is chlorine ($Cl_2$).

8. The method of claim 6, wherein the pretreatment gas mixture further comprises a group-III metal halide gas formed by exposing a metal source to a first processing gas comprising chlorine ($Cl_2$), and wherein the metal source comprises aluminum.

9. The method of claim 6, wherein forming the group-III metal nitride layer comprises exposing the one or more sapphire substrates to a nitrogen containing precursor gas and a gallium chloride containing gas.

10. The method of claim 6, wherein exposing the surface of the one or more sapphire substrates to the nitriding gas mixture comprises exposing the pretreated surface to the nitriding gas mixture.

11. The method of claim 6, wherein exposing the surface of the one or more sapphire substrates to the nitriding gas mixture is performed while the temperature of the one or more sapphire substrates is heated to the pretreatment temperature.

12. The method of claim 6, wherein forming the group-III metal nitride layer comprises exposing the one or more sapphire substrates to a nitrogen containing precursor gas, a first group-III metal halide gas and a second group-III metal halide gas, and the first and second group-III metal halide gases each comprise aluminum, gallium or indium.

13. The method of claim 12, wherein the nitrogen containing precursor gas comprises ammonia, the group-III metal halide gas is formed by exposing a metal source to a first processing gas comprising chlorine ($Cl_2$), and the metal source comprises an element selected from the group consisting of gallium, aluminum and indium.

14. The method of claim 6, wherein forming the group-III metal nitride layer comprises:
    exposing the one or more sapphire substrates to a nitrogen containing precursor gas and an aluminum chloride containing gas to form an aluminum nitride containing layer on the pretreatment surface; and
    exposing the formed aluminum nitride containing layer to a nitrogen containing precursor gas and a gallium chloride containing gas to form a gallium nitride containing layer on the aluminum nitride containing layer.

15. The method of claim 6, wherein the nitriding gas mixture comprises ammonia and a carrier gas.

16. The method of claim 15, wherein the carrier gas comprises nitrogen.

17. The method of claim 6, further comprising delivering a cleaning gas that comprises ammonia ($NH_3$) while the temperature of the one or more sapphire substrates is heated to the pretreatment temperature.

18. The method of claim 17, wherein the cleaning gas further comprises nitrogen.

19. The method of claim 6, wherein the sapphire substrate is a single crystal sapphire substrate.

* * * * *